(12) United States Patent
Heo et al.

(10) Patent No.: US 9,252,398 B2
(45) Date of Patent: Feb. 2, 2016

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Joon-Young Heo, Seoul (KR); Jong-Geun Yoon, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/676,511

(22) Filed: Apr. 1, 2015

(65) Prior Publication Data

US 2015/0214510 A1  Jul. 30, 2015

Related U.S. Application Data

(62) Division of application No. 13/921,993, filed on Jun. 19, 2013, now Pat. No. 9,023,678.

(30) Foreign Application Priority Data

Jun. 20, 2012 (KR) ........................ 10-2012-0066267

(51) Int. Cl.
*H01L 21/00* (2006.01)
*H01L 51/56* (2006.01)
*H01L 51/00* (2006.01)
(Continued)

(52) U.S. Cl.
CPC ............ *H01L 51/56* (2013.01); *H01L 51/0021* (2013.01); *H01L 51/5228* (2013.01); *H01L 27/326* (2013.01); *H01L 27/3211* (2013.01); *H01L 27/3246* (2013.01); *H01L 27/3248* (2013.01); *H01L 27/3276* (2013.01); *H01L 51/0018* (2013.01)

(58) Field of Classification Search
CPC .. H01L 51/0021; H01L 51/5228; H01L 51/56
USPC .......................................................... 438/35
See application file for complete search history.

(56) References Cited

U.S. PATENT DOCUMENTS

2002/0158835 A1   10/2002   Kobayashi et al.
2003/0214691 A1   11/2003   Magno et al.
(Continued)

FOREIGN PATENT DOCUMENTS

CN    1582078 A    2/2005
CN    1618042 A    5/2005
(Continued)

*Primary Examiner* — Douglas Menz
(74) *Attorney, Agent, or Firm* — Birch, Stewart, Kolasch & Birch, LLP

(57) ABSTRACT

A method of fabricating an organic light emitting diode display device, which include forming a thin film transistor in a display region of a substrate, forming a metal pattern on the substrate in the display region, forming a first electrode on the substrate connected to the thin film transistor, forming a bank on the substrate to expose a portion of the first electrode and a portion of the metal pattern, forming a hole common layer, an organic light emitting layer, and an electron common layer sequentially over the entire surface of the substrate provided with the first electrode, the bank and the metal pattern, forming a photoresist pattern covering the electrode common layer and removing the hole common layer, the organic light emitting layer and the electron common layer using the photoresist pattern as a mask, removing the photoresist pattern, and forming a second electrode on the electron common layer connected to the metal pattern.

5 Claims, 15 Drawing Sheets

(51) Int. Cl.
  *H01L 51/52* (2006.01)
  *H01L 27/32* (2006.01)

(56) References Cited

U.S. PATENT DOCUMENTS

2005/0112503 A1  5/2005  Kanda et al.
2010/0102335 A1  4/2010  Takagi et al.
2013/0169145 A1  7/2013  Adachi et al.

FOREIGN PATENT DOCUMENTS

| CN | 101278239 A | 10/2008 |
| CN | 101728421 A | 6/2010 |
| EP | 1505666 A2 | 2/2005 |

ORGANIC LIGHT EMITTING DIODE DISPLAY DEVICE AND METHOD OF FABRICATING THE SAME

CROSS-REFERENCE TO RELATED APPLICATIONS

This application is a divisional of co-pending U.S. patent application Ser. No. 13/921,993 filed on Jun. 19, 2013, and under 35 U.S.C. §119(a) claims priority to Korean Patent Application No. 10-2012-0066267, filed on Jun. 20, 2012, all of which are hereby expressly incorporated by reference into the present application.

BACKGROUND OF THE INVENTION

1. Technical Field

The present invention relates to a method of fabricating an organic light emitting diode display device, and more particularly, to a method of fabricating an organic light emitting diode display device capable of simplifying a manufacturing process. Furthermore, it relates to a diode display device.

2. Background Art

For an image display device which embodies a variety of information on a screen as a core technology in advanced information and communication, there is continuous progress in development of slim, lightweight, and portable devices with improved performance. Hereupon, organic light emitting diode display devices that display an image by adjusting an amount of light emitted from an organic light emitting layer are recently receiving attention as flat panel display devices having reduced weight and volume, which are drawbacks of cathode ray tubes (CRTs).

An organic light emitting diode display device applies an electric field to an anode and a cathode formed at both ends of an organic light emitting layer so as to inject and transfer electrons and holes into the organic light emitting layer, thereby utilizing an electroluminescence phenomenon in which light energy is released through recombination of the electrons and holes. The electrons and holes, which are paired with each other in the organic light emitting layer, emit light when falling from an excited state to a ground state.

Organic light emitting diode display devices have a slim design and operate at a lower driving voltage, e.g., at about 10 V or less, than plasma display panels (PDPs) or inorganic electroluminescent (EL) displays, thereby consuming less power. Much attention has been paid to organic light emitting diode display devices due to excellent characteristics thereof in terms of weight and color.

Hereinafter, a conventional organic light emitting diode display device will be described with reference to the accompanying drawings.

FIG. 1 is a cross-sectional view illustrating a conventional organic light emitting diode display device.

Referring to FIG. 1, a conventional organic light emitting diode display device includes a substrate 10 in which a display region and a non-display region are defined and a plurality of organic light emitting cells formed in the display region of the substrate 10. Each of the organic light emitting cells includes an anode 20 connected to a transistor (not shown) formed on the substrate 10, a hole common layer 30a, an organic light emitting layer 40, an electron common layer 30b, and a cathode 60.

When the organic light emitting cell applies a voltage to the anode 10 and the cathode 60 via a pad region (not shown) formed in the non-display region of the substrate 10, holes from the anode 20 and electrons from the cathode 60 are injected into the organic light emitting layer 40. Then, the holes and electrons injected into the organic light emitting layer 40 recombine to create excitons that emit light when falling from an excited state to a ground state.

Meanwhile, as organic light emitting diode display devices are increased in display area, resistance of the cathode 60 increases. In particular, since the cathode 60 is formed of a transparent metal in a top emission type organic light emitting diode display device in which light emitted from the organic light emitting layer is transmitted through the substrate 100, resistance of the cathode 60 further increases. Thus, in a conventional organic light emitting diode display device, resistance of the cathode 60 may be reduced by forming a metal pattern 20a using a low resistance metal and connecting the metal pattern 20 with the cathode 60.

However, the metal pattern 20a formed in the same layer as the anode 10, the organic light emitting layer 40, the hole common layer 30a, and the electron common layer 30b should be formed using a shadow mask such that the organic light emitting layer 40, the hole common layer 30a, and the electron common layer 30b are only formed on a portion of the anode 20 exposed by a bank 50 formed to define the luminescent region of a sub pixel. Thus, a complex process and a high cost are required to fabricate conventional organic light emitting diode display devices.

SUMMARY OF THE INVENTION

Accordingly, the present invention is directed to a method of fabricating an organic light emitting diode display device that substantially obviates one or more problems due to limitations and disadvantages of the related art.

An object of the present invention is to provide a method of fabricating an organic light emitting diode display device capable of simplifying a manufacturing process and reducing manufacturing costs.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

One of the main ideas of the invention is to provide a structure allowing during manufacturing to expose the metal pattern in a very simple manner without requiring a shadow mask process. This is structure is based on specially formed bank and on a correspondingly formed photoresist pattern, which is placed over the metal pattern. This allows to easily remove the layered structure including the OLED stack of layers by a stripping process.

In particular, the objects can be addressed by a method for fabricating an organic light emitting diode display device, comprising: forming a thin film transistor in a display region of a substrate, the substrate having a display region and a non-display region; forming a metal pattern on the substrate; in the display area; forming a first electrode on the substrate connected to the thin film transistor; forming a bank on the substrate to expose a portion of the first electrode and a portion of the metal pattern; forming a photoresist pattern to cover the metal pattern; forming a hole common layer, an organic light emitting layer, and an electron common layer sequentially over the entire surface of the substrate provided with the first electrode and the photoresist pattern; removing the photoresist pattern and forming a second electrode on the electron common layer connected to the metal pattern.

The objects can also be addressed by a method of fabricating an organic light emitting diode display device including: forming a thin film transistor in a display region of a substrate in which the display region and a non-display region are defined, forming a metal pattern on the substrate, forming a first electrode on the substrate to be connected to the thin film transistor, forming a photoresist pattern to cover the metal pattern, forming a hole common layer, an organic light emitting layer, and an electron common layer sequentially over the entire surface of the substrate provided with the first electrode and the photoresist pattern, removing the photoresist pattern, and forming a second electrode on the electron common layer to be connected to the metal pattern.

The objects can also be addressed by a method of fabricating an organic light emitting diode display device, comprising the steps of: forming a thin film transistor in a display region of a substrate, the substrate having a display region and a non-display region; forming a metal pattern on the substrate in the display region; forming a first electrode on the substrate connected to the thin film transistor; forming a bank on the substrate to expose a portion of the first electrode and a portion of the metal pattern; forming a hole common layer, an organic light emitting layer, and an electron common layer sequentially over the entire surface of the substrate provided with the first electrode, the bank and the metal pattern; forming a photoresist pattern covering the electrode common layer and removing the hole common layer, the organic light emitting layer and the electron common layer using the photoresist pattern as a mask; removing the photoresist pattern; and forming a second electrode on the electron common layer connected to the metal pattern.

In another aspect of the present invention, a method of fabricating an organic light emitting diode display device includes forming a thin film transistor in a display region of a substrate in which the display region and a non-display region are defined, forming a metal pattern on the substrate, forming a first electrode on the substrate to be connected to the thin film transistor, forming a hole common layer, an organic light emitting layer, and an electron common layer sequentially over the entire surface of the substrate provided with the first electrode and the metal pattern, forming a photoresist pattern exposing the electrode common layer to correspond to the metal pattern and removing the hole common layer and the electron common layer using the photoresist pattern as a mask, removing the photoresist pattern, and forming a second electrode on the electron common layer to be connected to the metal pattern.

By forming a hole common layer and an electron common layer according to the invention no shadow mask is required.

The forming of a photoresist pattern may include coating a photoresist over the entire surface of the substrate provided with the first electrode and the metal pattern, and forming a photoresist pattern having a reverse trapezoidal shape by exposing and developing the photoresist.

The forming of the organic light emitting layer may be performed by forming an organic light emitting material emitting white light over the entire surface of the substrate.

The hole common layer, the organic light emitting layer, and the electron common layer formed on the photoresist pattern may be simultaneously removed to expose the metal pattern during removal of the photoresist pattern.

Alternatively, the forming of the organic light emitting layer may be performed by forming organic light emitting materials respectively emitting red, green, and blue light on each of sub pixels.

Then, the hole common layer and the electron common layer formed on the photoresist pattern may be simultaneously removed to expose the metal pattern during removal of the photoresist pattern, since on the portion of the photoresist pattern no organic light emitting layer is provided.

The metal pattern may be formed in the display region.

The metal pattern may alternatively or additionally be a contact region formed in the non-display region and which is transferring an external signal to the second electrode.

The method may further include forming an auxiliary electrode over the entire surface of the substrate provided with the organic light emitting layer before removing the photoresist pattern.

The photoresist pattern and the developer may be formed of a fluorine-containing material.

The metal pattern and the first electrode may be made simultaneously by the same material.

The objects can be addressed by an organic light emitting diode display device, comprising: an array substrate having a display region and a non-display region; a plurality of organic light emitting cells formed in the display region of the substrate, wherein each of the organic light emitting cells includes: at least one thin film transistor, a metal pattern on the substrate in the display region; a first electrode on the substrate connected to the thin film transistor; a bank on the substrate partially overlapping a portion of the first electrode and a portion of the metal pattern; a hole common layer, an organic light emitting layer, and an electron common layer sequentially formed over the first electrode, the bank; a second electrode partially covering the bank and fully covering the electron common layer, the second electrode is connected to the metal pattern.

Preferably, the organic light emitting diode display device, may further comprise a color filter substrate including color filters, the color filter substrate is facing the array substrate.

Preferably, metal pattern may be spaced apart from the first electrode on the substrate. In other words, there might be a distance between the metal pattern and the first electrode both formed on the substrate in the same layer.

Preferably, the bank may have a trapezoidal shape or at least one side trapezoidal shape, wherein the inclined side of the bank may face in the direction of the metal pattern.

Preferably, the metal patterns may have at least one of the forms of: islands between organic light emitting cells, respectively; horizontal stripes; vertical stripes; crossed pattern surrounding the organic light emitting cells.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting diode display device according to the present invention will be described in detail with reference to the accompanying drawings.

First Embodiment

FIGS. 2A to 2G are cross-sectional views for describing a method of fabricating an organic light emitting diode display device according to a first embodiment of the present invention. FIG. 3 is a cross-sectional view illustrating the organic light emitting diode display device including an auxiliary electrode according to the first embodiment of the present invention.

Figure 1:
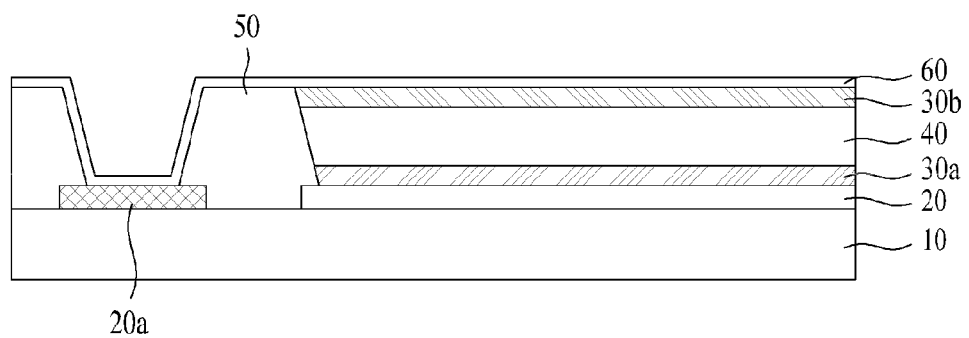
FIG. 1 is a cross-sectional view illustrating a conventional organic light emitting diode display device.
Figure 2A:
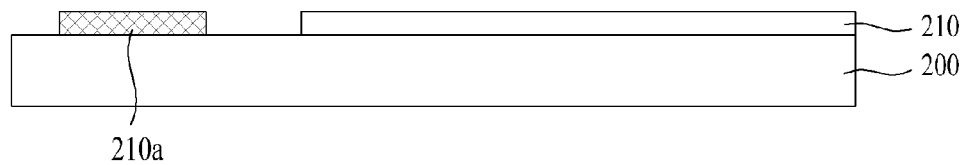
FIGS. 2A to 2G are cross-sectional views for describing a method of fabricating an organic light emitting display device according to a first embodiment of the present invention.
Figure 3:
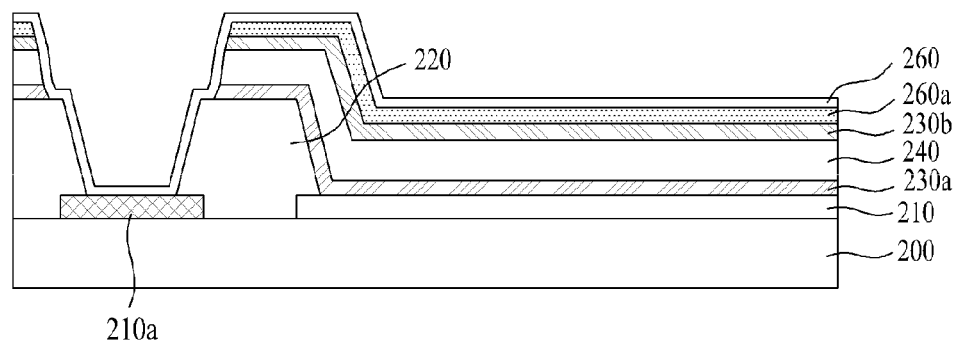
FIG. 3 is a cross-sectional view illustrating the organic light emitting display device including an auxiliary electrode according to the first embodiment of the present invention.

Referring to FIG. 2A, a substrate 200 has a display region and a non-display region, and the display region has a plurality of sub pixels. Thin film transistors (not shown) are formed on the substrate 200 to respectively correspond to the sub pixels. The substrate 200 may be formed of various materials such as glass, plastic, and silicone.

Each of the thin film transistors includes a gate electrode, a gate insulator, a semiconductor layer, a source electrode, and a drain electrode. A passivation layer is formed on the substrate 200 provided with the thin film transistor using an organic or inorganic insulating material. The passivation layer is selectively removed to expose the drain electrode. Then, a first electrode 210, which constitutes an anode and is electrically connected to the drain electrode, is formed on the passivation layer by a deposition method such as sputtering.

Particularly, in a top emission type organic light emitting diode display device in which light emitted from an organic light emitting layer, which will be described later, proceeds upward to the substrate 200, the first electrode 210 may have a double layer structure formed by sequentially laminating a transparent conductive material such as tin oxide (TO), indium tin oxide (ITO), indium zinc oxide (IZO), and indium tin zinc oxide (ITZO) and a metallic material with high reflectivity such as aluminum (Al) or an aluminum alloy (AlNd).

In this regard, Al or AlNd reflects light emitted from the organic light emitting cell upward. The first electrode 210 may also have a triple layer structure formed by further laminating a transparent conductive material on Al or AlNd.

Then, a metal pattern 210a is formed in the same layer as the first electrode 210. Here, the metal pattern 210a may be formed simultaneously with the first electrode 210 or before or after forming the first electrode 210.

First, when the first electrode 210 and the metal pattern 210a are simultaneously formed, the metal pattern 210a also has a double layer or triple layer structure as in the first electrode 210. When the metal pattern 210a is formed before or after forming the first electrode 210, a low resistance metal such as aluminum (Al), molybdenum (Mo), and copper (Cu) is patterned to form the metal pattern 210a.

The metal pattern 210a is connected to the second electrode formed in the display region, which will be described later, to reduce resistance of the second electrode. That is, since resistance of the second electrode increases as the area of the substrate increases, the metal pattern 210a formed of a low resistance metal is connected to the second electrode in the display region to reduce resistance of the second electrode. Thus, the metal pattern serves as assistance pattern.

Figure 2B:
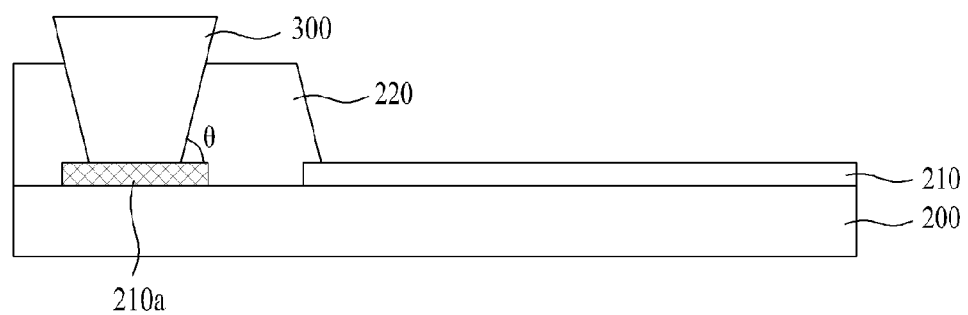

Then, as illustrated in FIG. 2B, a bank 220 is formed on the substrate 200. The bank 220 is formed in the display region to define a luminescent region of each sub pixel. Generally, the bank 220 is formed to expose only a portion of the first electrode 210. However, according to the present invention, the bank 220 is formed to expose not only a portion of the first electrode 210 but also a portion of the metal pattern 210a for electrical connection between the metal pattern 210a and the second electrode, which will be described later.

Then, a photoresist is coated over the entire surface of the substrate 200, exposed to light, and developed to form a photoresist pattern 300 covering the exposed metal pattern 210a. In this regard, the photoresist pattern 300 may have an upper end having a greater width than a lower end such that a hole common layer and an electron common layer, which will be described later, are not formed on the side surfaces of the photoresist pattern 300. Particularly, the photoresist pattern 300 is formed in a reverse trapezoidal shape in which an angle (θ) between an upper surface of the metal pattern 210a and a side surface of the photoresist pattern 300 is less than 90°.

In particular, the photoresist pattern 300 may have a greater thickness than the bank 220 to facilitate penetration of a stripper between the photoresist pattern 300 and the bank 220 when the photoresist pattern 300 is removed to expose the metal pattern 210a.

Figure 2C:
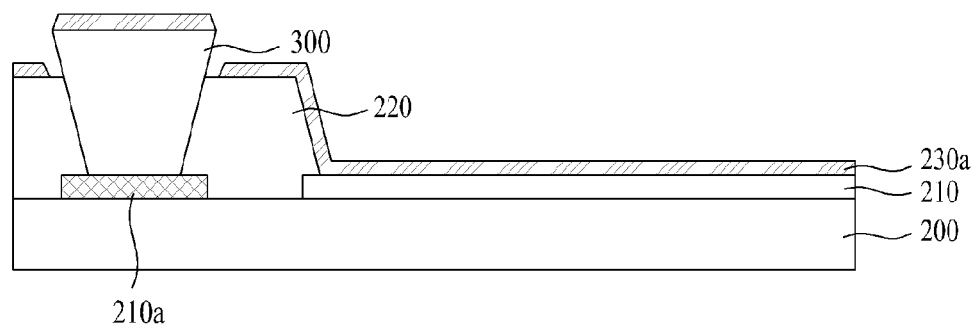

Then, as illustrated in FIG. 2C, a hole common layer 230a including a hole transport layer (HTL) and a hole injection layer (HIL) is formed over the substrate 200.

As described above, since a metal pattern is exposed outside in conventional organic light emitting diode display devices, a hole common layer is formed using a shadow mask to prevent formation of the hole common layer on the metal pattern. Accordingly, a manufacturing process thereof is complicated and manufacturing costs therefor increase.

However, according to the present invention, the photoresist pattern 300 is formed in a reverse trapezoidal shape to cover the metal pattern 210a. Accordingly, the hole common layer 230a may be formed over the substrate 200 without using a mask. As a result, the hole common layer 230a is discontinuously formed at stepped portions between the bank 220 and the photoresist pattern 300.

Figure 2D:
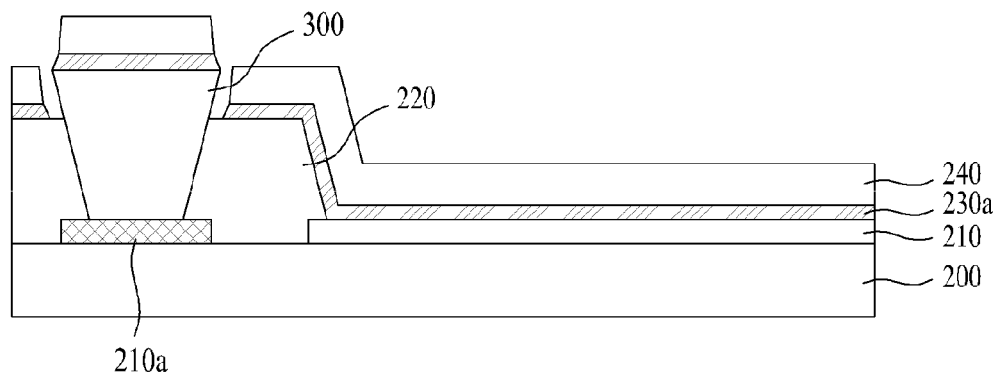

Then, as illustrated in FIG. 2D, an organic light emitting layer 240 is formed on the hole common layer 230a. The organic light emitting layer 240 may be formed over the entire surface of the substrate 200 without using a mask as in the hole common layer 230a, or may be formed to overlap the first electrode 210 in a region where the bank 220 is not formed. The former case is illustrated herein.

Particularly, when the organic light emitting layer 240 is formed over the entire surface of the substrate 200, the organic light emitting layer 240 including a white light emitting material emits white light. In this case, although not shown herein, each of the sub pixels respectively includes red (R), green (g), and blue (B) color filters. Thus, white light emitted from the organic light emitting layer 240 may respectively realize red, green, and blue light while passing through the R, G, and B, color filters, respectively.

When the organic light emitting layer 240 is formed to overlap the first electrode 210 in a region where the bank 220 is not formed, the organic light emitting layer 240 includes R, G, and B organic light emitting materials. Accordingly, the organic light emitting layer 240 emits red, green, and blue light without using the R, G, and B color filters. In this case, the organic light emitting layer 240 may be formed by depositing the R, G, and B organic light emitting materials using a shadow mask having openings respectively corresponding to the sub pixels. The organic light emitting layer 240 may also be formed by printing the R, G, and B organic light emitting materials through inkjet printing without using a mask.

Figure 2E:
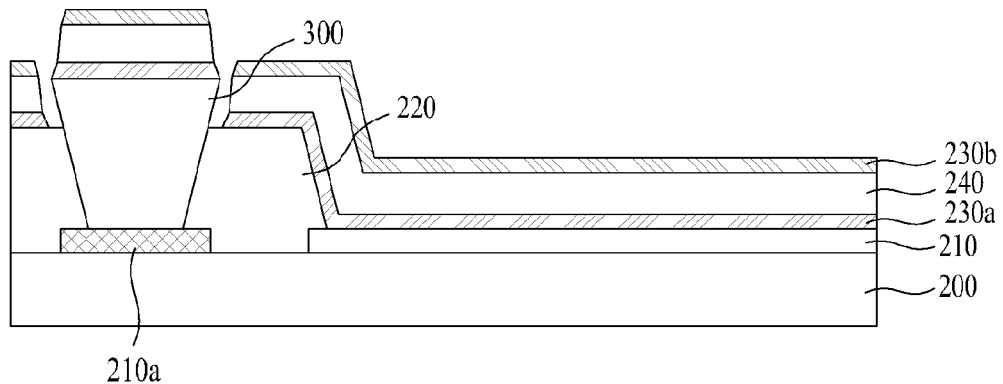

Then, as illustrated in FIG. 2E, an electron common layer 230b including an electron injection layer (EIL) and an electron transport layer (ETL) is formed over the entire surface of the substrate 200 provided with the organic light emitting layer 240.

In this regard, since the photoresist pattern 300 has a greater thickness than the bank 220, the organic light emitting layer 240 and the electron common layer 230b are also discontinuously formed at the stepped portions between the bank 220 and the photoresist pattern 300 similarly to the hole common layer 230a. Particularly, since the photoresist pattern 300 is formed in a reverse trapezoidal shape, the hole common layer 230a, the organic light emitting layer 240, and the electron common layer 230b are not formed on the side surfaces of the photoresist pattern 300.

Figure 2F:
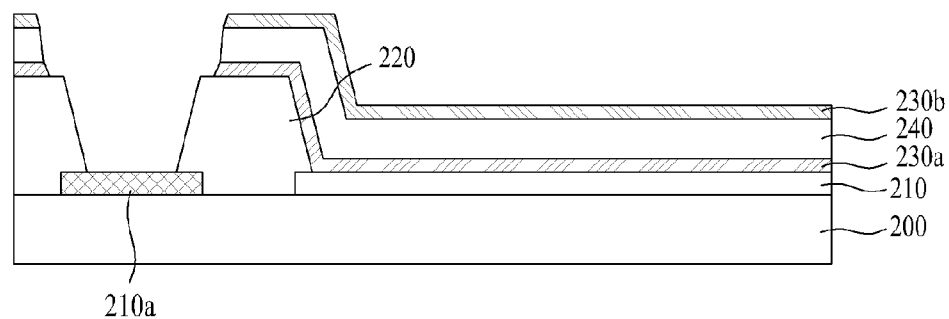

Then, as illustrated in FIG. 2F, the photoresist pattern 300 is removed using a stripper to expose the metal pattern 210a. In this regard, the stripper is formed of a fluorine-containing material in order not to cause damage to the organic light emitting layer 240, and the photoresist and a developer may also be formed of a fluorine-containing material.

Figure 2G:
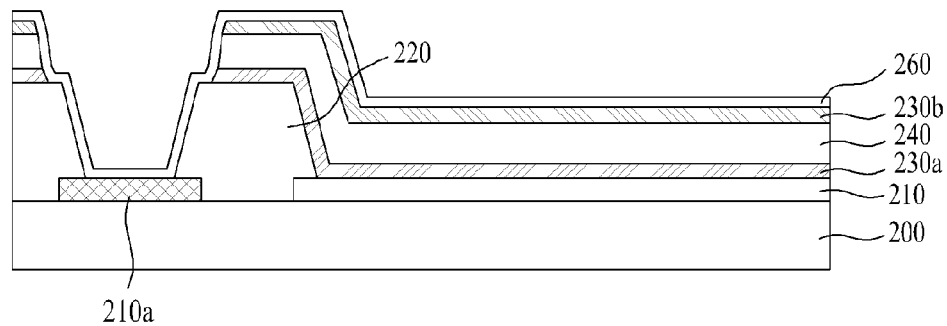

Finally, as illustrated in FIG. 2G, a second electrode 260 that constitutes a cathode is formed over the entire surface of the substrate 200 provided with the exposed metal pattern 210a. The second electrode 260 is formed of a transparent metal such that light emitted from the organic light emitting layer 240 passes through the second electrode 260 to be emitted to the outside. Particularly, the second electrode 260 may be formed of a magnesium alloy (Mg:Ag) with a low work function. The second electrode 260 may have a small thickness, e.g., 50 nm or less, so as to transmit light emitted from the organic light emitting layer 240.

That is, since the photoresist pattern 300 is formed to cover the metal pattern 210a in the organic light emitting diode display device according to the present invention, the hole common layer 230a and the electron common layer 230b are formed over the entire surface of the substrate 200 without using a shadow mask. Then, the photoresist pattern 300 is removed to expose the metal pattern 210a, and the second electrode 260 is formed to be connected to the metal pattern 210a. Thus, when a large area organic light emitting diode display device is formed, resistance of the second electrode 260 may be reduced, a manufacturing process may be simplified, and manufacturing costs therefor may be reduced.

In particular, as illustrated in FIG. 3, an auxiliary electrode 260a may further be disposed between the organic light emitting layer 240 and the second electrode 260 in order to minimize damage to the organic light emitting layer 240 caused by the stripper while removing the photoresist pattern 300. In this regard, the auxiliary electrode 260a is formed before removing the photoresist pattern 300.

In this case, the auxiliary electrode 260a may be formed of a magnesium alloy, and the second electrode 260 may be formed of a transparent conductive material such as tin oxide (TO), indium tin oxide (ITO), indium zinc oxide (IZO), and indium tin zinc oxide (ITZO).

Meanwhile, the method of fabricating an organic light emitting diode display device according to the present invention may also be applied to a contact region formed in a non-display region of a substrate to transfer an external signal to a second electrode.

FIGS. 4A to 4D are cross-sectional views for describing a method of connecting a contact region formed on a substrate with a second electrode to transfer an external signal to the second electrode according to the first embodiment of the present invention.

Figure 4A:
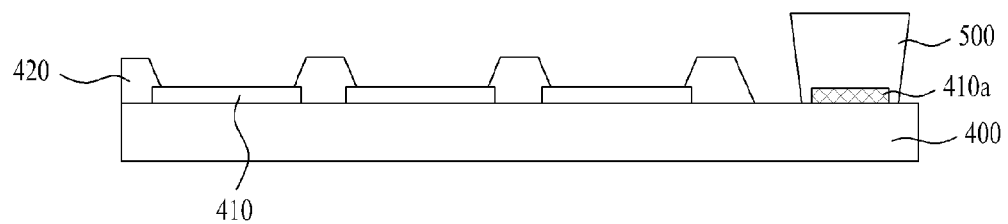
FIGS. 4A to 4D are cross-sectional views for describing a method of connecting a contact region formed on a substrate with a second electrode to transfer an external signal to the second electrode according to the first embodiment of the present invention.

First, referring to FIG. 4A, a substrate 400 has a display region and a non-display region, and a thin film transistor (not shown) is formed in the display region. Then, a first electrode 410 connected to the thin film transistor (not shown) is formed in the display region, and a contact region 410a is formed in the non-display region. As described above, a pad region (not shown) formed in the non-display region and a second electrode, which will be described later, are electrically connected to each other via the contact region 410a to transfer an external signal to the second electrode through the contact region 410a. The contact region 410a may be formed over the entire surface or on a portion of the non-display region.

Then, a bank 420 is formed on the substrate 400. The bank 420 is formed within the display region and exposes a portion of the first electrode 410 to define a luminescent region of each sub pixel. Then, a photoresist pattern 500 is formed in a reverse trapezoidal shape in a non-luminescent region to cover the contact region 410a. In this regard, the photoresist pattern 500 is formed to cover the contact region 410a.

Particularly, the photoresist pattern 500 may have an upper end having a greater width than a lower end as described above. Particularly, the photoresist pattern 500 is formed in a reverse trapezoidal shape in which an angle (θ) between an upper surface of the contact region 410a and a side surface of the photoresist pattern 500 is less than 90°.

Figure 4B:
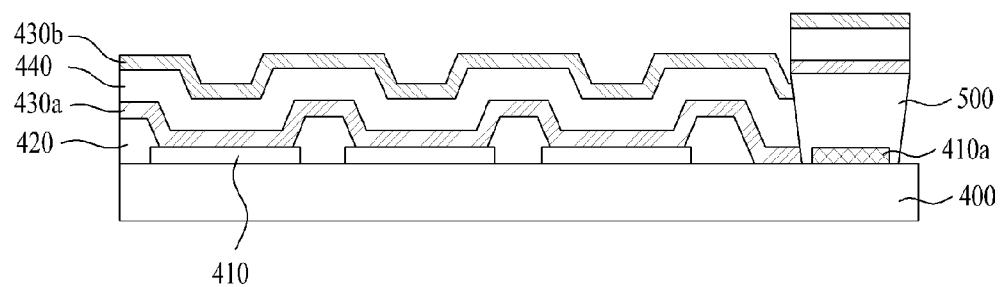

Then, as illustrated in FIG. 4B, a hole common layer 430a is formed over the entire surface of the substrate 400. The hole common layer 430a is discontinuously formed at stepped portions between the substrate 400 and the photoresist pattern 500. In addition, an organic light emitting layer 440 is formed on the hole common layer 430a.

The organic light emitting layer 440 may be formed of a white light emitting material over the entire surface of the substrate 400 as illustrated herein, such that white light emitted from the organic light emitting layer 440 realizes red, green, and blue light while respectively passing through R, G, and B color filters mounted at each of the sub pixels. Alternatively, the organic light emitting layer 440 may include R, G, and B organic light emitting materials and may be formed to overlap the first electrode 410 in a region where the bank 420 is not formed.

Then, an electron common layer 430b is formed on the organic light emitting layer 440. The electron common layer 430b is also formed over the entire surface of the substrate 400 without using a mask. In this regard, the hole common layer 430a, the organic light emitting layer 440, and the electron common layer 430b are discontinuously formed at stepped portion of the photoresist pattern 500.

Figure 4C:
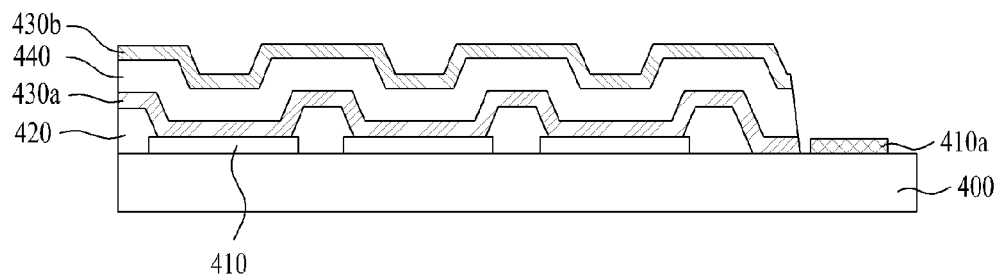

Then, as illustrated in FIG. 4C, the photoresist pattern 500 is removed using a stripper to expose the contact region. In this regard, the stripper is formed of a fluorine-containing material in order not to cause damage to the organic light emitting layer 440, and the photoresist and a developer may also be formed of a fluorine-containing material.

Figure 4D:
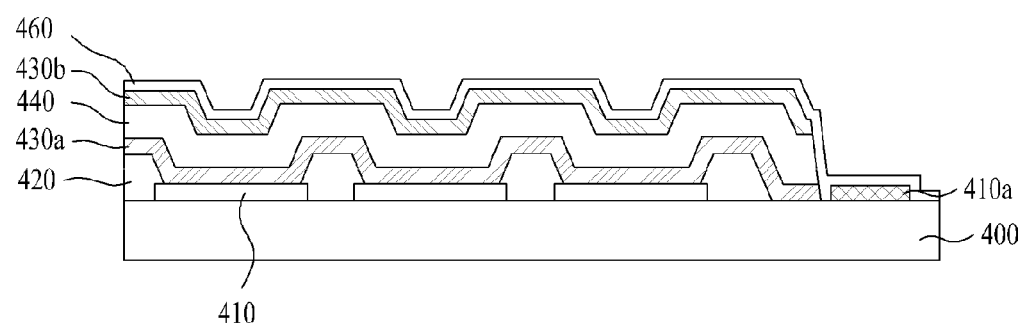

Finally, as illustrated in FIG. 4D, a second electrode 460 that constitutes a cathode is formed over the entire surface of the substrate 400 provided with the electron common layer 410a. The second electrode 460 is electrically connected to the contact region 410a and is electrically connected to the pad region of the non-display region through the contact reign 410a. Accordingly, an external signal may be applied to the second electrode 460.

That is, the hole common layer 430a and the electron common layer 430b are not formed on the contact region 410a that electrically connects the pad region formed in the non-display region of the substrate 400 with the second electrode 460 using the method of fabricating the organic light emitting diode display device according to the present invention, such that a manufacturing process may be simplified.

Second Embodiment

FIGS. 5A to 5F are cross-sectional views for describing a method of fabricating an organic light emitting diode display device according to a second embodiment of the present invention.

Figure 5A:
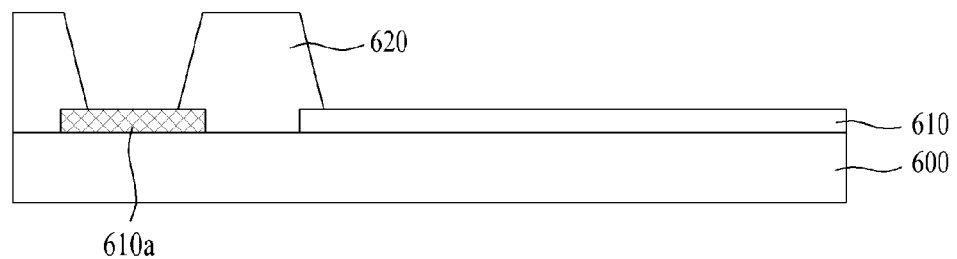
FIGS. 5A to 5F are cross-sectional views for describing a method of fabricating an organic light emitting diode display device according to a second embodiment of the present invention.

Referring to FIG. 5A, a thin film transistor (not shown) is formed on a substrate 600 in each of the sub pixels. Then, a passivation layer is formed on the substrate 600 provided with the thin film transistor using an organic or inorganic insulating material. The passivation layer is selectively removed to expose a drain electrode. Then, a first electrode 610, which constitutes an anode and is electrically connected to the drain electron, is formed on the passivation layer.

Particularly, the first electrode 610 may have a double layer structure formed by sequentially laminating a transparent conductive material such as tin oxide (TO), indium tin oxide (ITO), indium zinc oxide (IZO), and indium tin zinc oxide (ITZO) and a metallic material with high reflectivity such as aluminum (Al) or an aluminum alloy (AlNd) such that light generated in an organic light emitting layer, which will be described later, proceeds upward to the substrate 600. In this regard, Al or AlNd reflects light emitted from the organic light emitting cell upward. The first electrode 610 may also have a triple layer structure formed by further laminating a transparent conductive material on Al or AlNd.

Then, a metal pattern 610a is formed in the same layer as the first electrode 610. Here, the metal pattern 610a may be formed in the display region simultaneously with the first electrode 610 or before or after forming the first electrode 610.

First, when the first electrode 610 and the metal pattern 610a are simultaneously formed, the metal pattern 610a also has a double layer or triple layer structure similarly to the first electrode 610. When the metal pattern 610a is formed before or after forming the first electrode 610, a low resistance metal such as aluminum (Al), molybdenum (Mo), and copper (Cu) is patterned to form the metal pattern 610a.

Then, a bank 620 is formed on the substrate 600. The bank 620 is formed to expose a portion of the first electrode 610 and a portion of the metal pattern 610a.

Figure 5B:
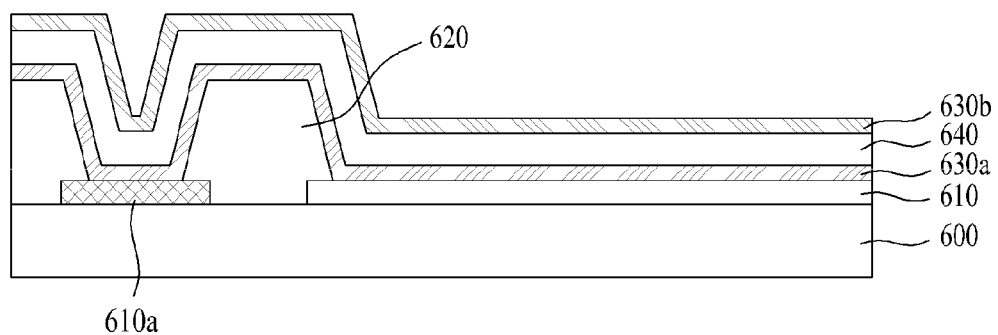

Then, as illustrated in FIG. 5B, a hole common layer 630a is formed over the entire surface of the substrate 600. Particularly, when the organic light emitting diode display device includes sub pixels respectively including an R, G, or B color filter, and an organic light emitting layer 640 emits white light, the organic light emitting layer 640 is also formed over the entire surface of the substrate 600 similarly to the hole common layer 630a, and an electron common layer 630b is formed over the entire surface of the organic light emitting layer 640. That is, the hole common layer 630a, the organic light emitting layer 640, and the electron common layer 630b are formed over the entire surface of the substrate 600 without using a mask.

Meanwhile, although not shown herein, the organic light emitting layer 640 may be formed using a shadow mask. In this case, the organic light emitting layer 640 is formed to overlap the first electrode 610 in a region where the bank 620 is not formed and includes R, G, and B organic light emitting materials. Thus, the organic light emitting layer 640 emits red, green, and blue light without using color filters.

Figure 5C:
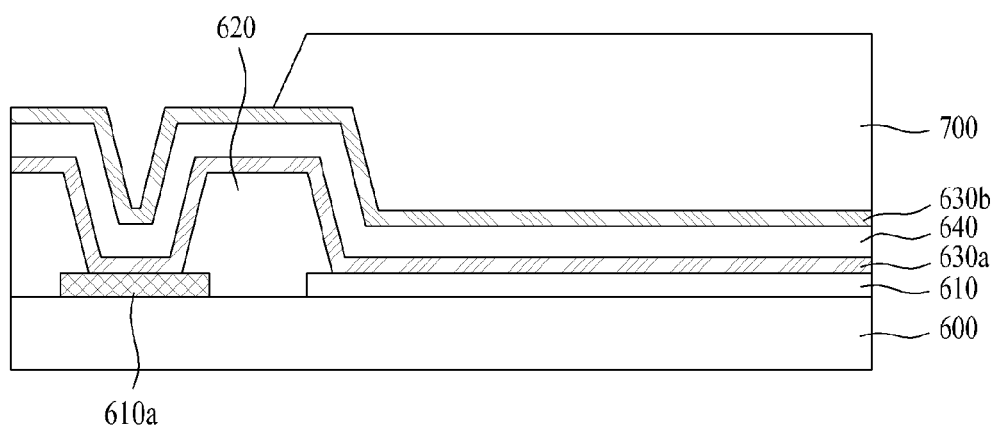
Figure 5D:
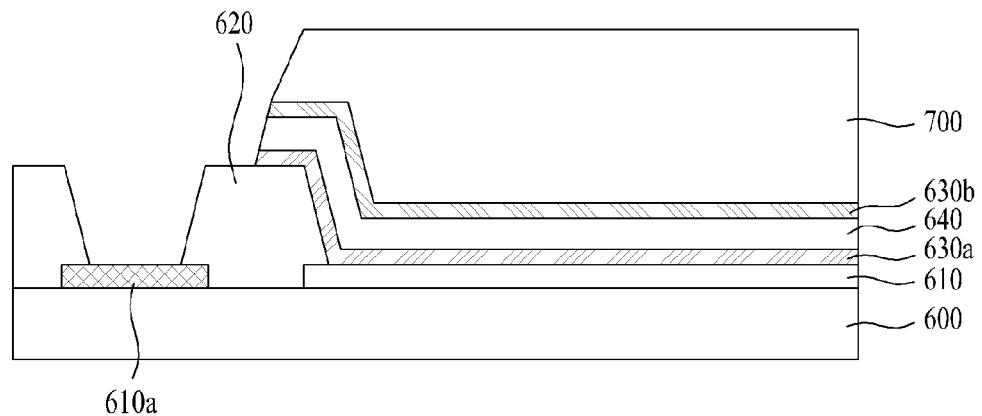

Then, as illustrated in FIG. 5C, a photoresist is coated over the entire surface of the electron common layer 630b, exposed to light, and developed to form a photoresist pattern 700 exposing the electron common layer 630b in a region corresponding to the metal pattern 610a. Then, as illustrated in FIG. 5D, the exposed hole common layer 630a, organic light emitting layer 640, and electron common layer 630b are removed by dry etching using the photoresist pattern 700 as a mask to expose the metal pattern 610a.

Particularly, as described above, when the organic light emitting layer 640 is formed to overlap the first electrode 610 only in a region where the bank 620 is not formed using a shadow mask, the hole common layer 630a and the electron common layer 630b are only formed on the region corresponding to the metal pattern 610a. Accordingly, the hole common layer 630a and the electron common layer 630b are removed by dry etching to expose the metal pattern 610a.

Figure 5E:
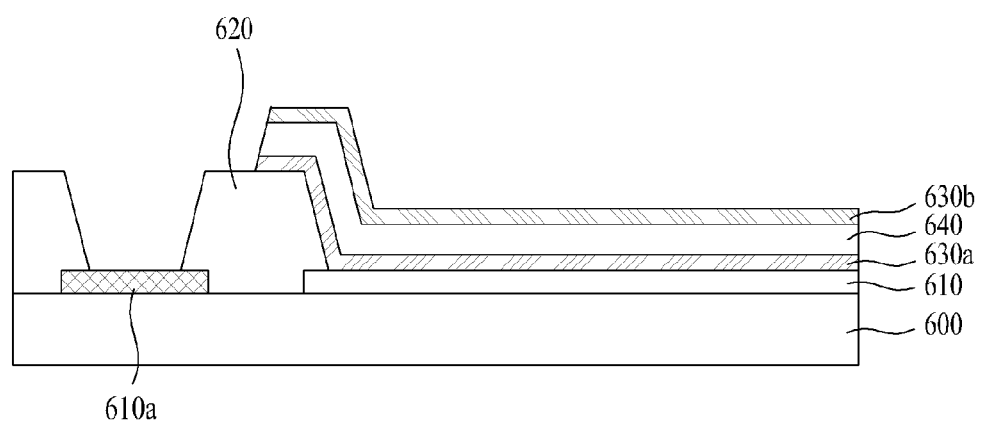

Then, as illustrated in FIG. 5E, the remaining photoresist pattern 700 is removed using a stripper to expose the electron common layer 630b. Particularly, the stripper is formed of a fluorine-containing material in order not to cause damage to the organic light emitting layer 640, and the photoresist and a developer may also be formed of a fluorine-containing material.

Figure 5F:
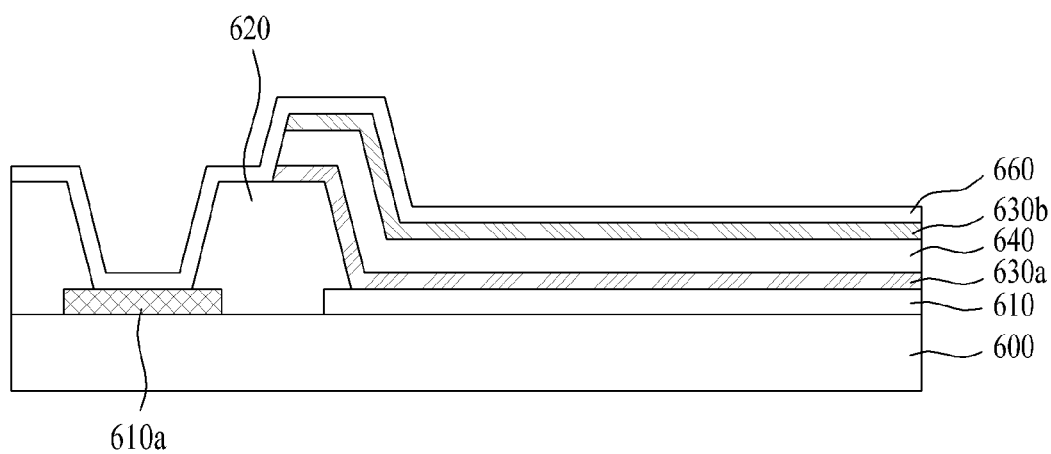

Finally, as illustrated in FIG. 5F, a second electrode 660 that constitutes a cathode is formed over the entire surface of the substrate 600 provided with the exposed metal pattern 610a. The second electrode 660 may be formed of a transparent metal such that light emitted from the organic light emitting layer 640 passes through the second electrode 660 to be emitted outside. Particularly, the second electrode 660 may be formed of a magnesium alloy (Mg:Ag) with a low work function to a thickness of 50 nm or less to allow transmission of light.

That is, as described above, according to the method of fabricating an organic light emitting diode display device according to the second embodiment of the present invention, the hole common layer 630a and the electron common layer 630b may also be formed over the entire surface of the substrate 600 without using a shadow mask. The metal pattern 610a used to reduce resistance of the second electrode 660 may also be exposed by removing the hole common layer 630a and the electron common layer 640b by removing the photoresist in a region corresponding to the metal pattern 610a. Thus, a manufacturing process may be simplified, and manufacturing costs may be reduced.

Particularly, although not shown herein, an auxiliary electrode (not shown) may further be disposed on the electron common layer 630b in order to minimize damage to the organic light emitting layer 640 caused by the stripper while removing the photoresist pattern 700. In this regard, the auxiliary electrode (not shown) may be formed of a magnesium alloy, and the second electrode 660 may be formed of a transparent conductive material such as tin oxide (TO), indium tin oxide (ITO), indium zinc oxide (IZO), and indium tin zinc oxide (ITZO) FIGS. 6A to 6E are plan views illustrating shapes of metal patterns formed on substrates.

Figure 6A:
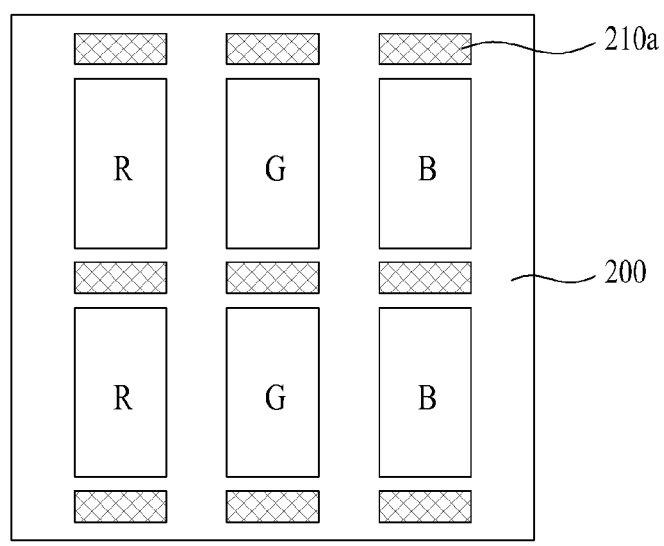
FIGS. 6A to 6E are plan views illustrating shapes of metal patterns formed on substrates according to an embodiment of the present invention.
Figure 6B:
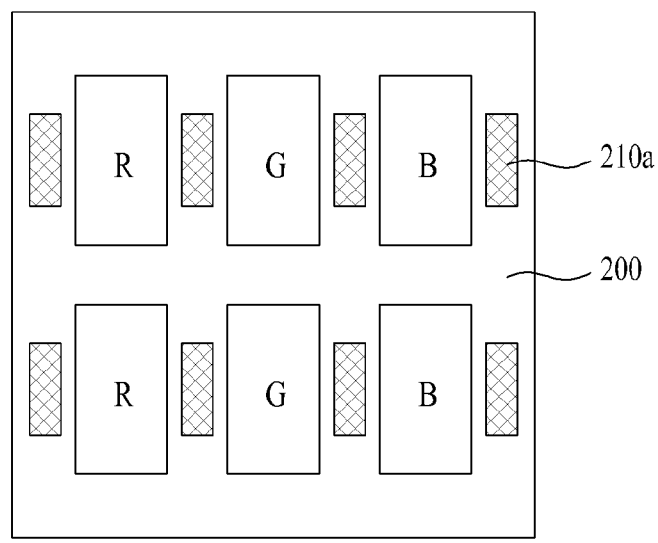
Figure 6C:
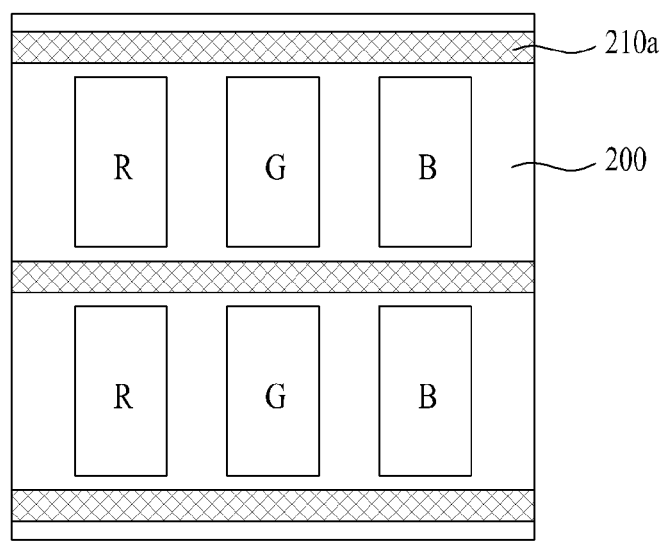
Figure 6D:
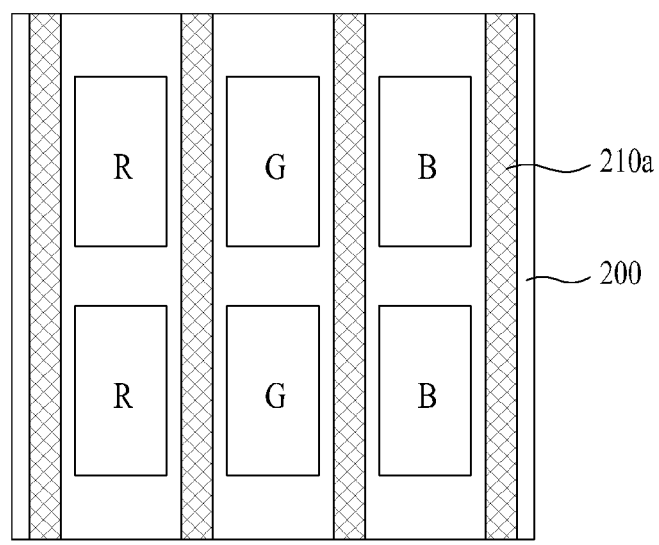
Figure 6E:
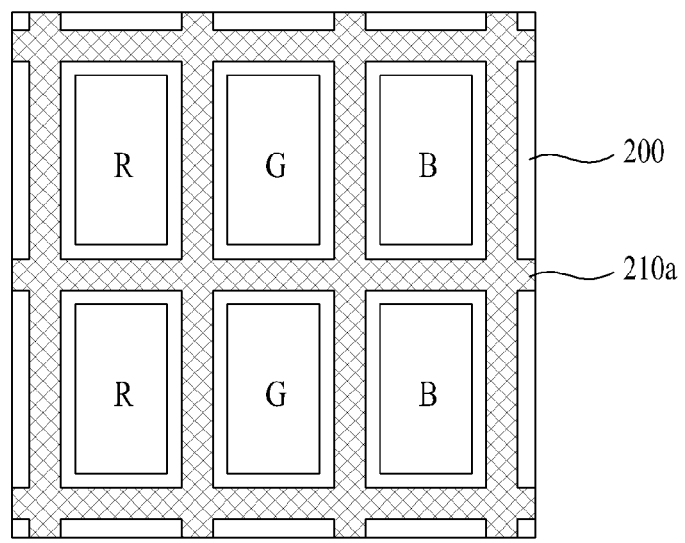

Referring to FIGS. 6A and 6B, metal patterns 210a may be formed as islands between R, G, and B organic light emitting cells respectively to correspond to the R, G, and B organic light emitting cells. Alternatively, each of the metal patterns 210a may be formed to correspond to a plurality of organic light emitting cells as illustrated in FIGS. 6C and 6D. In addition, the metal pattern 210a may be formed to surround edges of the organic light emitting cells as illustrated in FIG. 6E.

Meanwhile, although not shown herein, the method of fabricating the organic light emitting diode display device according to the second embodiment of the present invention may also be applied to a contact region formed in the non-display region of the substrate and transmitting an external signal to the second electrode.

As described above, according to the method of fabricating the organic light emitting diode display device, the photoresist pattern is formed on the metal pattern. Thus, although the hole common layer and the electron common layer are formed over the entire surface of the substrate without using a mask, the hole common layer and the electron common layer may not be formed on the metal pattern. In addition, since the photoresist pattern is formed only in a region where the metal pattern is not formed, the metal pattern may be connected to the second electrode by exposing the metal pattern by removing the exposed hole common layer and electron common layer. Thus, the manufacturing process may be simplified, and manufacturing costs may be reduced by forming the hole common layer and the electron common layer over the entire surface of the substrate without using a mask.

In addition, since the photoresist pattern, the developer, and the stripper are formed of fluorine-containing materials, damage to the organic light emitting layer may be prevented during the development and removal of the photoresist. In addition, the auxiliary electrode formed between the organic light emitting layer and the second electrode may prevent the organic light emitting layer from being exposed to the stripper, thereby improving reliability.

Furthermore, the first and second embodiments as described above may also be applied to a process of connecting the contact region with the second electrode to transfer an external signal of a pad region formed in the non-display region to the second electrode.

As is apparent from the above description, the method of fabricating an organic light emitting diode display device according to the present invention has the following effects.

First, resistance of the second electrode may not be increased in a large area organic light emitting diode display device by use of a low resistance metal pattern to be electrically connected to the second electrode that constitutes a cathode.

Second, since the photoresist pattern is formed on the metal pattern, the hole common layer and the electron common layer are not formed on the metal pattern even though the hole common layer and the electron common layer are formed over the entire surface of the substrate without using a mask, thereby simplifying the manufacturing process and reducing manufacturing costs therefor.

Third, since the photoresist pattern, the developer, and the stripper are formed of fluorine-containing materials, damage to the organic light emitting layer may be prevented while developing and removing the photoresist. Furthermore, the auxiliary electrode is formed between the organic light emitting layer and the second electrode to prevent the organic light emitting layer from being exposed to the stripper, thereby improving reliability of the organic light emitting diode display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating an organic light emitting diode display device, the method comprising:
    forming a thin film transistor in a display region of a substrate, the substrate having a display region and a non-display region;
    forming a metal pattern on the substrate in the display region;
    forming a first electrode on the substrate connected to the thin film transistor;
    forming a bank on the substrate to expose a portion of the first electrode and a portion of the metal pattern;
    forming a hole common layer, an organic light emitting layer, and an electron common layer sequentially over the entire surface of the substrate provided with the first electrode, the bank and the metal pattern;
    forming a photoresist pattern to cover the electrode common layer above the first electrode and to open the electrode common layer above the metal pattern;
    removing the electron common layer, the organic light emitting layer and the hole common layer on the metal pattern using the photoresist pattern as a mask by dry etching;
    removing the photoresist pattern; and
    forming a second electrode on the electron common layer connected to the metal pattern.

2. The method according to claim 1, wherein the forming of the organic light emitting layer is performed by forming an organic light emitting material emitting white light over the entire surface of the substrate or by forming organic light emitting materials respectively emitting red, green, and blue light on each of sub pixels.

3. The method according to claim 1, wherein the organic light emitting layer overlapping the metal pattern is simultaneously removed during removal of the hole common layer and the electron common layer.

4. The method according to claim 1, wherein the photoresist pattern and the developer are formed of a fluorine-containing material.

5. The method according to claim 1, wherein the metal pattern and the first electrode are made simultaneously by the same material.

* * * * *